(12) United States Patent
Yaniv et al.

(10) Patent No.: US 6,586,829 B1
(45) Date of Patent: Jul. 1, 2003

(54) BALL GRID ARRAY PACKAGE

(75) Inventors: Zvi Yaniv, Bloomfield Hills, MI (US); Daniel Bruce Bullock, Austin, TX (US); Curtis Nathan Potter, Austin, TX (US)

(73) Assignee: SI Diamond Technology, Inc., Austin, TX (US)

( * ) Notice: Subject to any disclaimer, the term of this patent is extended or adjusted under 35 U.S.C. 154(b) by 646 days.

(21) Appl. No.: 08/993,487

(22) Filed: Dec. 18, 1997

(51) Int. Cl.[7] ............................................. H01L 23/48
(52) U.S. Cl. ...................................................... 257/693
(58) Field of Search ......................................... 257/693

(56) References Cited

U.S. PATENT DOCUMENTS

| | | | | |
|---|---|---|---|---|
| 4,190,855 A | * | 2/1980 | Inoue | 357/80 |
| 5,347,159 A | * | 9/1994 | Khandros et al. | 257/692 |
| 5,633,783 A | * | 5/1997 | Yamamoto | 361/704 |
| 5,763,059 A | * | 6/1998 | Yamaguchi et al. | 428/209 |
| 5,834,835 A | * | 11/1998 | Maekawa | 257/680 |

OTHER PUBLICATIONS

Jan Vardaman, *The Complete Solder Paste Printing Process, What Does a CSP Cost?*, Jun. 1997, pp. 56–60.
Ed Caracappa, *On Improving BGA Reliability*, Jun. 1997, pp. 44–46.

* cited by examiner

*Primary Examiner*—Douglas A. Wille
(74) *Attorney, Agent, or Firm*—Kelly K. Kordzik; Winstead Sechrest & Minick P.C.

(57) ABSTRACT

The present invention provides a glass BGA (ball grid array) including a glass substrate having a plurality of conductive leads, such as thin film metal deposited thereon. A die or chip is mounted in a fixed relationship to the glass substrate, and is often mounted on the glass substrate. The die includes a plurality of I/O pads for providing electrical access to circuitry inside the die. Circuitry is included for connecting the plurality of I/O pads to the plurality of conductive leads on the glass substrate.

16 Claims, 4 Drawing Sheets

BALL GRID ARRAY PACKAGE

TECHNICAL FIELD

The present invention relates to ball grid array packages.

BACKGROUND INFORMATION

Ball grid array (BGA) packages are chip-support substrates that possess a form factor change to an integrated circuit (IC) making the IC having a very high count of inputs and outputs compatible with mainstream product assembly technologies. In this respect, BGA packages are recognized as advantageous with respect to other packaging technology, in particular, for high input/output devices and high performance modules. Based on recent reports, the demand for BGAs will grow tremendously in the next several years.

SUMMARY OF THE INVENTION

The present invention provides a glass BGA (ball grid array) including a glass substrate having a plurality of conductive leads, such as thin film metal deposited thereon. A die or chip is mounted in a fixed relationship to the glass substrate, and is often mounted on the glass substrate. The die includes a plurality of I/O pads for providing electrical access to circuitry inside the die. Circuitry is included for connecting the plurality of I/O pads to the plurality of conductive leads on the glass substrate.

The die may be mounted in a recess formed in the glass substrate. Alternatively, the die may be mounted on a second substrate through a hole in the glass substrate.

A further alternative may provide a heat sink attached to the die using thermally conductive adhesives.

The entire assembly may be attached to a printed circuit board ("PCB") whereby the individual conductive leads on the glass substrate are electrically connected to conductive traces on the PCB.

One advantage of the present invention is that the use of glass for the basic BGA material allows for low cost BGA fabrication.

Another advantage of the present invention is that the surface quality of glass is superior for producing thin film patterns with low defects.

Yet still another advantage of the present invention is that when glass is utilized as the BGA base material, full visual inspection of the die surface and underfill medium is available after the flip bonding and heat sink attachment.

Yet still a further advantage of the present invention is that it provides for direct heat removal from the back of the die to the heat sink and then to the board when the heat sink is mounted thereon.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
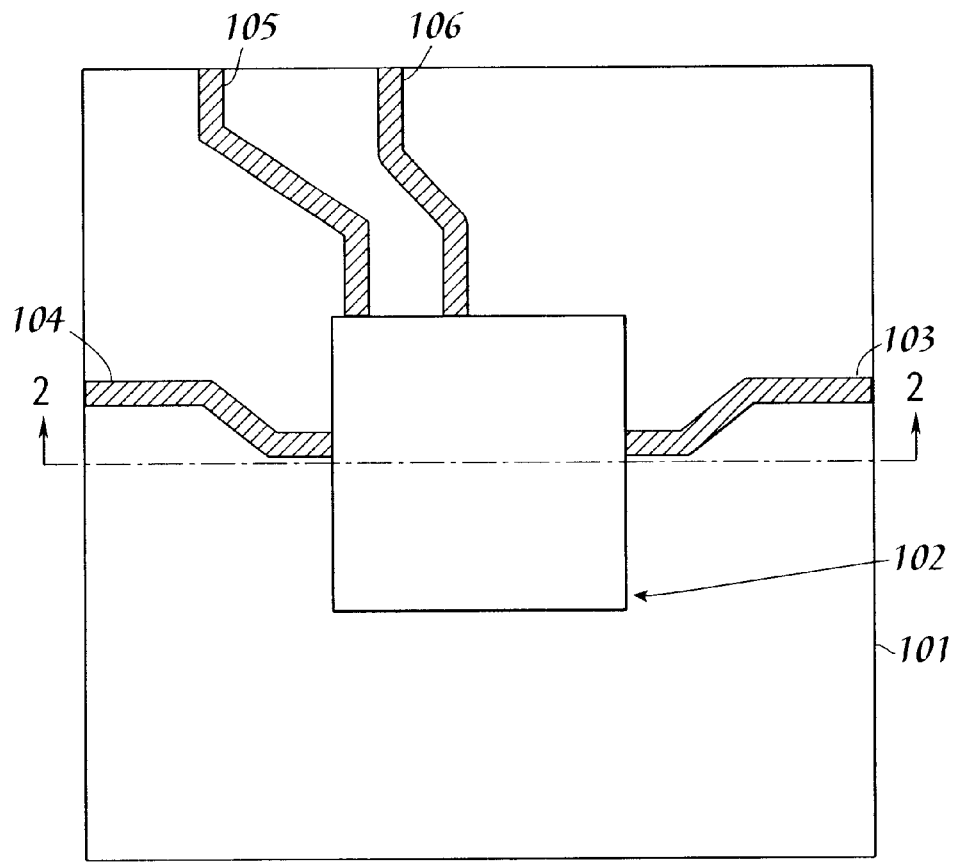
FIG. 1 illustrates a top view of one embodiment of the present invention.

In the following description, numerous specific details are set forth such as specific materials, etc. to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

Figure 2:
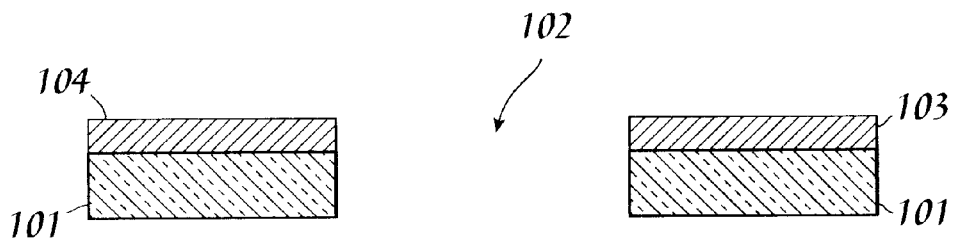
FIG. 2 illustrates a side cut-out view of the embodiment illustrated in FIG. 1.

Referring to FIGS. 1 and 2, there is illustrated one embodiment of the present invention, which includes glass or ceramic substrate 101 having a hole 102 formed therein. Hole 102 may pass through the entire width of substrate 101, or, as illustrated below with respect to FIG. 5, only be formed a certain distance through substrate 101. The glass hole 102 is etched using wet chemistry with hydrofluoric acid and appropriate resist or metal masks to form the pattern. Alternatively, ultrasonic cutting tools can be utilized with appropriate abrasives and tool heads shaped to provide the geometry desired. Glass provides a uniquely flat and smooth surface due to the intrinsic nature of the glass plate fabrication process as exemplified by the float process. The glass industry has provided ultra flat glass for the LCD flat panel industry at very low cost due to very high volumes.

Shown on substrate 101 are conductive leads 103–106. Only these four leads are shown for purposes of clarity. However, a multitude of such leads may be deposited on substrate 101. Conductive leads 103–106, which may comprise a thin-film metal, are formed on substrate 101 using a conventional glass metallization process. The glass metallization process is well-known in the industry and utilizes an adhesion layer of typically chrome or titanium tungsten metal followed by a highly conductive layer of copper, aluminum or gold deposited, for example, by a vacuum sputter or evaporation deposition.

Figure 3:
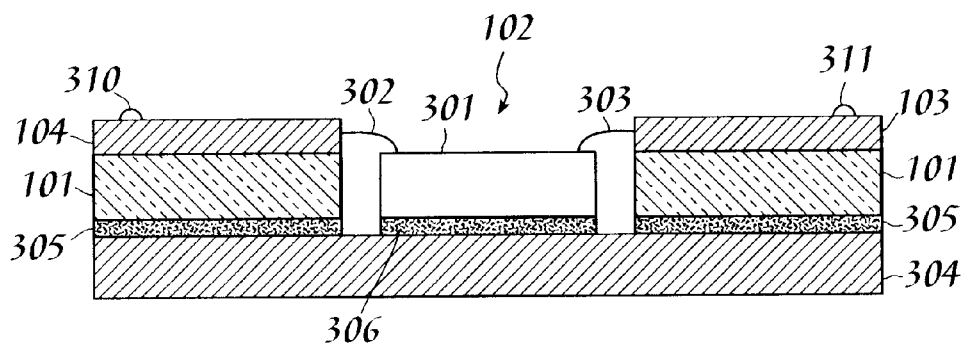
FIG. 3 illustrates a BGA package in accordance with the present invention.

Referring to FIG. 3, there is illustrated substrate 101 with leads 103–104 deposited thereon as discussed above with respect to FIGS. 1–2, along with hole 102 formed therein. Substrate 101 is mounted onto heat sink 304 with a thermal or ultraviolet-curable (UV-curable) adhesive 305. Within hole 102, integrated circuit 301 is mounted onto heat sink 304 with thermal or ultraviolet-curable adhesive 306. Head sink 304 acts to dissipate heat from substrate 101 and integrated circuit 301. Leads on input/output (I/O) pads (not shown) on integrated circuit 301 are coupled to leads 103–104 using wire-bonded leads 303–302, respectively.

BGA contacts 310 and 311 are formed on leads 104 and 103, respectively, in a well-known manner. As a result, external access to integrated circuit 301 is provided through BGA contacts 310 and 311, leads 104 and 103, and wire leads 302 and 303.

Figure 4:
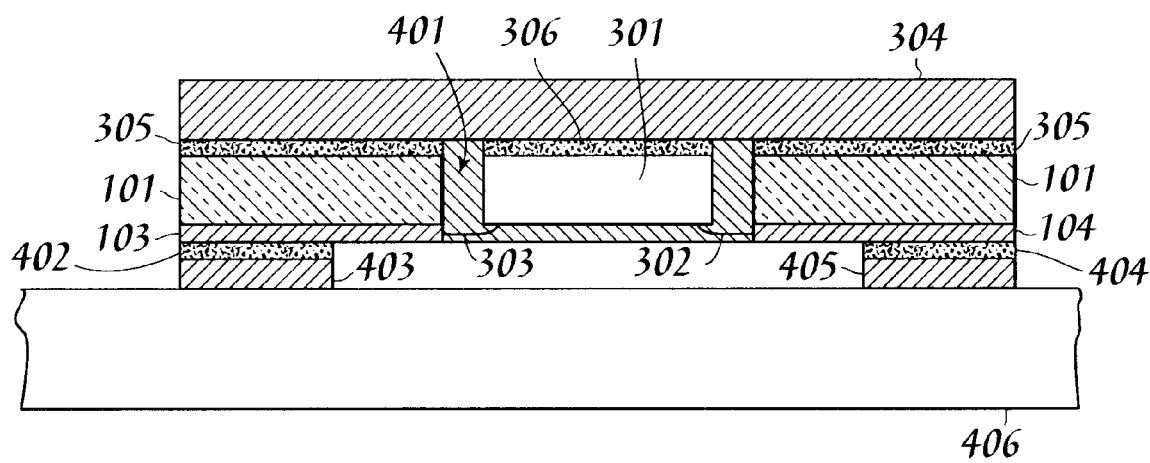
FIG. 4 illustrates an alternative embodiment of the present invention.

Referring next to FIG. 4, there is illustrated the apparatus described above with respect to FIG. 3 with a layer of passivation 401 within the cavity formed by hole 102 with integrated circuit 301 mounted therein. The passivation layer 401 comprises a flowable organic underfill, which is typical in the assembly industry, and is cured to a solid state by UV radiation or heat. It provides near hermetic protection against moisture penetration to the IC chip as well as some degree of radiation protection from the outside environment to the IC junctions. The apparatus does not include BGA contacts 310 and 311; instead, leads 103 and 104 are coupled to leads 403 and 405, respectively, on printed circuit board ("PCB") 406 using anisotropic z-axis interconnects ("AZF") 402 and 404, respectively. The structure of FIG. 4 uses a configuration which is standard in the industry for attaching BGAs to PC boards but with the additional advantages of using the low cost glass BGA 101 with an integral heat sink 304.

Figure 5:
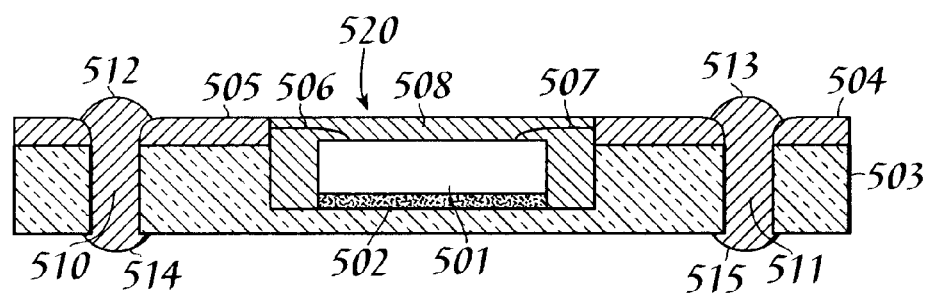
FIG. 5 illustrates an alternative embodiment of the present invention.

Referring next to FIG. 5, there is illustrated another alternative embodiment of the present invention whereby substrate 503, which is similar to substrate 101 has integrated circuit 501 mounted therein using thermal or UV-curable adhesive 502. Integrated circuit 501 is mounted within cavity 520 in substrate 503. Leads 504 and 505 are similar to leads 103–106 described above with respect to FIGS. 1–4. I/O contacts (not shown) on integrated circuit 501 are coupled to leads 504 and 505 using wire bond leads 507 and 506, respectively. A passivation 508 is deposited within the cavity 520 within which integrated circuit 501 is mounted.

Holes 510 and 511 are formed within substrate 503 whereby metal material 512 and 513 is deposited therein with a BGA-type contact 514 and 515 on the underside of substrate 503. As a result, a BGA array can be formed on the underside of substrate 503 to provide electrical access to integrated circuit 501 mounted on the other side of substrate 503. As an example, electrical access to one of the I/O pads (not shown) on integrated circuit 501 is provided through wire bond lead 506, interconnect lead 506, metal material 512, and BGA contact 514. The feedthrough holes 510 and 511 are formed in glass by conventional laser drilling or abrasive grinding techniques. The holes 510, 511 are metallized by vacuum metal deposition then are filled with conductive metal by conventional high through plating techniques using copper for example. Metal contacts 512, 513, 514 and 515 are typically formed from plated or screen printed solder and may be limited to the BGA surface only or allowed to penetrate through holes 510 and 511 as shown in FIG. 5.

The advantages of this configuration are that the IC 501 is visible for inspection after the BGA is mounted to the PC board by reflow of solder contacts 514 and 515.

Figure 6:
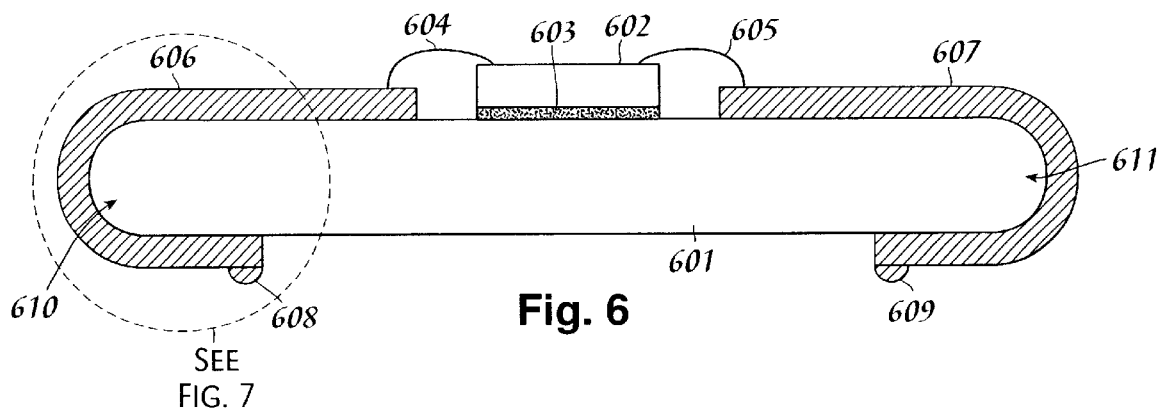
FIG. 6 illustrates an alternative embodiment of the present invention.
Figure 7:
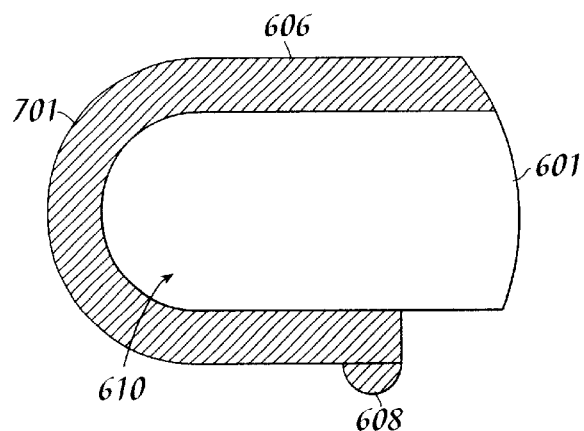
FIG. 7 illustrates further detail of a portion of the embodiment illustrated in FIG. 6.

Referring next to FIGS. 6 and 7, there is illustrated another alternative embodiment of the present invention whereby substrate 601 has rounded edges 610 and 611. Rounded edges 610 and 611 provide for a more uniform thin metal coating over the 180° change of direction around the BGA edge as well as a reduction in thin metal film stress that would result if the edge of the BGA exhibited sharp corners. Alternatively, leads 606 and 607 can be made on thin flex material separately from the glass BGA then adhesive bonded to the glass which can provide a potentially lower cost solution to forming leads directly on the glass.

The edge rounding on the glass BGA can be accomplished using conventional grinding techniques such as are employed in edge beveling of silicon wafers or glass flat panel plates. Diamond grinding wheels can also be employed. Integrated circuit 602 is mounted on substrate 601 using adhesive 603. Interconnect leads 606 and 607, which may be a thin film metal, are deposited on substrate 601, including being deposited around rounded edges 610 and 611 to the underside of substrate 601. Formed on the leads 606 and 607, on the underside of substrate 601, are BGA contact 608 and 609. Connection between integrated circuit 602 and interconnect lead 606 and 607 is provided by wire bond leads 604 and 605, respectively.

FIG. 7 illustrates that to provide a good contact around rounded edges 610 and 611, a copper or other plated metal may be formed on top of the formed thin film metal 606. The plated copper or other metal such as gold or nickel can be deposited much thicker than vacuum deposited thin film and thus provide a much lower resistance path for electrical current.

The primary advantage of the BGA configuration in FIG. 6 is that it avoids having to make through vias as shown in FIG. 5. A significant advantage is found in using the separately fabricated flex as described above since it avoids the difficulty of doing lithography (patterning) on three-dimensional surfaces. Additionally, the flex when made separately can be manufactured at low cost.

Figure 8:
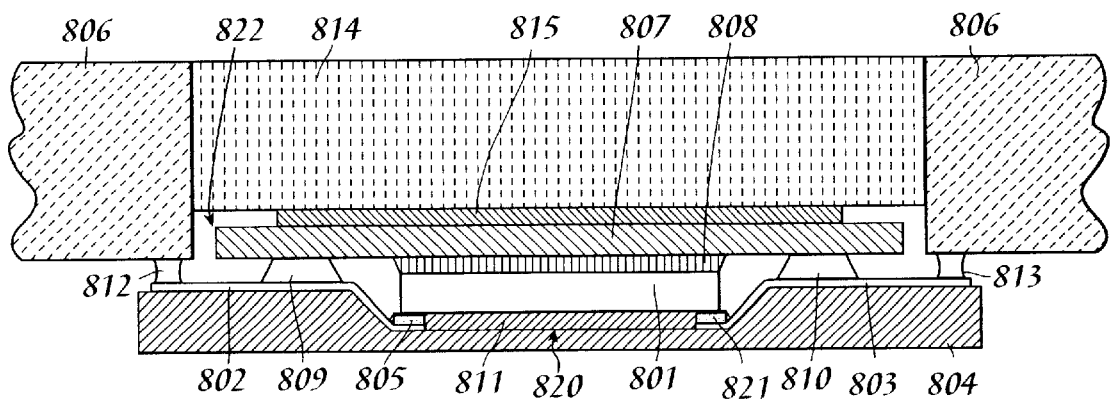
FIG. 8 illustrates an alternative embodiment of the present invention.

Referring next to FIG. 8, there is illustrated a cross-sectional view of another alternative embodiment of a glass BGA where the glass body 804 contains a well 820 into which die 801 is recessed. Reroute leads 802 and 803 run from the recess bottom 820 outward to solder pads 812 and 813 at the periphery of the BGA 804. The pattern of such leads 802, 803 may be similar to the illustration in FIG. 1, where opening 102 corresponds somewhat to recess 820. Die 801 is flip bonded to BGA 804 using a z-axis adhesive with underfill 811 such that bond pads 805 and 821 on die 801 make electrical contact to the inside end of reroute traces 802 and 803.

Heat sink 807 is thermally connected to the back side of die 801 using a thermally conductive adhesive 808 while simultaneously being bonded to BGA 804 using adhesive 809, 810. Adhesives 808, 809, and 810 can be of identical composition, except that adhesive 808 is loaded with conductive particles while adhesives 809 and 810 are unloaded and insulating.

The BGA glass-based material is of a TCE (thermal coefficient of expansion) intermediate between the silicon die $3 \times 10^{-6}$ ppm and the board material $15 \times 10^{-6}$ to ppm. TCE intermediate refers to the glass having an expansion coefficient somewhere (preferably about 6 parts per million per degree centigrade (ppm/° C.) change in temperature) between silicon ($3 \times 10^{-6}$ ppm/° C.) and a typical PC board ($15 \times 10^{-6}$ ppm/° C.).

Specifically, the TCE is ppm per ° C. For example, in simple terms, the TCE indicates quantitatively how much of a change in length a substance will undergo for every 1 degree change in temperature. Therefore, with a rod 1,000,000 centimeters long made of glass (at 6 ppm/° C.), for every 1 degree change in temperature the rod will become 6 cm longer or shorter depending on the direction of the temperature change. Glass metallization is employed with chrome or TiW alloy adhesion layer on glass to hold copper or gold reroute traces. The copper or gold reroute 802, 803 is plated to several microns thickness.

The die 801 is prepared for flip chip adhesive bonding by applying gold or compliant bumps 805, 821. The die 801 is bonded onto the glass BGA 804 using anisotropic z-axis adhesive with underfill 811. The underfill 811 mitigates the stress between die 801 and glass BGA 804 due to the thermal mismatch.

The heat sink 807 is attached using a silver or diamond loaded adhesive 808 between die 801 and heat sink 807 and a normal unloaded adhesive 809, 810 between BGA 804 and heat sink 807.

Final assembly is made by solder reflowing, 812, 813 between assembly 804, 801 and 807 to the PC (printed circuit) board opening 822 on board 806. Optional copper or other high thermal conductivity inserts 814 may be placed or imbedded in the PC board 806 at the location just behind the heat sink 807, and an adhesive or solder connection 815 between heat sink 807 and insert 814.

The advantages for using the assembly shown in FIG. 8 include:
(1) Use of glass for the basic BGA material 804 allows for very low cost BGA fabrication, especially when using soda lime glass.
(2) The surface quality of glass is superior for producing thin film patterns (leads 802, 803) with low defects.
(3) When glass is utilized as the BGA base material 804, full visual inspection of the die 801 surface and underfill medium is available after the flip bonding and heat sink 807 attachment.
(4) The basic configuration provides for direct heat removal from the back of the die 801 to the heat sink 807 then to the board 806 when the heat sink 807 is mounted.

Figure 9:
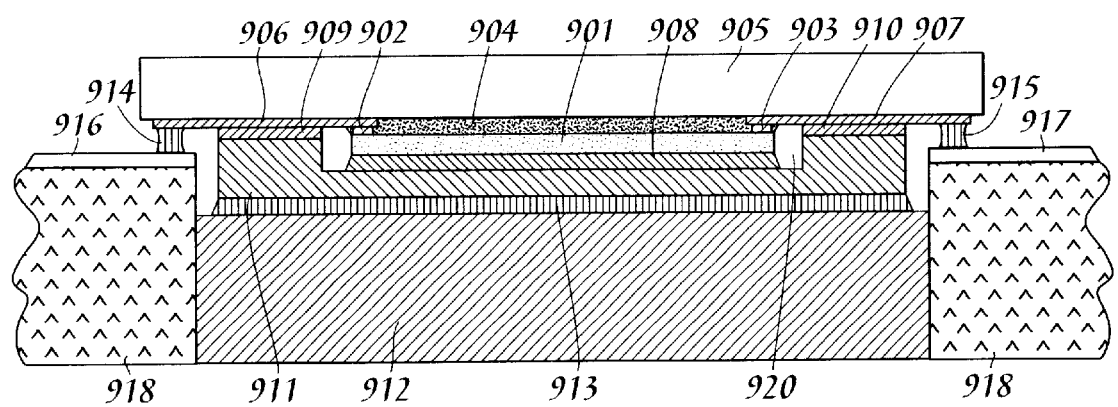
FIG. 9 illustrates an alternative embodiment of the present invention.

Referring now to FIG. 9, the structure of the BGA in glass does not require a cavity for die placement. All the thin film routing on the glass 905 is accomplished on a planar surface. In this configuration, the semiconductor die 901 is bonded in flip chip mode directly to the matching I/O pads 902 and 903 on the glass BGA 905. The die-to-BGA bonding technique employs z-axis adhesive materials 904 utilizing gold bumps or compliant bumps 902, 903 where TCE mismatch between die 901 and BGA 905 is large. The use of compliant bumps enables the shear forces due to the TCE mismatch to be mitigated through compliant lateral flexure of the compliant bumps. Once the die 901 is attached to the BGA 905 and underfilled using conventional underfill material 904, the die 901 and BGA 905 are a single rugged unit.

Next, the heat sink 911 with integral cavity 920 is attached to the BGA assembly using thermally conductive adhesive 908 and normal insulating adhesive 909, 910 peripheral to the die cavity 920. The cavity 920 in the heat sink 911 is precise in depth so as to accept the die 901 of correct thickness. The two adhesives 908 and 909, 910 are cured simultaneously which when completed provide an integral assembly of die 901, BGA 905 and heat sink 911. This composite assembly can now be handled using standard pick and place equipment for placement on board 918.

The final assembly of die/BGA/heat sink to board 918 is accomplished by pick and place and conventional solder technology. Solder balls 914, 915 at the periphery of the BGA 905 are reflowed to solder site on the PC board 918 while the heat sink 911 is simultaneously using solder 913 to copper or other heat sink material 912 embedded in the PC board 918.

Thus, with the assembly completed as shown in FIG. 9, a complete electrical path is provided from interconnect wiring 916, 917 on PC board 918 through solder connections 914, 915 to fanout traces 906, 907 on BGA 905 to bumps 902 and 903 and then to circuitry on chip 901.

The advantages for using the assembly shown in FIG. 9 are related to the use of transparent glass for the BGA 905:

(1) Use of glass as a BGA base material allows for low cost BGA fabrication.
(2) Glass is an exemplary smooth surface for the fabrication of thin film structures.
(3) Glass can be fabricated or very wide range of TCE's for matching die to board TCE.
(4) Glass is transparent so full visual inspection of the die to BGA interface can be made through the whole assembly process.
(5) The basic configuration allows for a direct and massive heat removal from the back of the die into a variety of heat sinks on the PC board.
(6) The sequence of the assembly process is compatible with current pick and place and flip chip bonding equipment.

Although the present invention and its advantages have been described in detail, it should be understood that various changes, substitutions and alterations can be made herein without departing from the spirit and scope of the invention as defined by the appended claims.

What is claimed is:

1. An apparatus comprising:
    a glass substrate having a plurality of conductive leads deposited thereon;
    a die mounted on the glass substrate, the die having a plurality of input/output ("I/O") pads for providing electrical access to circuitry inside the die; and
    circuitry for connecting the plurality of I/O pads to the plurality of conductive leads on the glass substrate, wherein the connecting circuitry further comprises a plurality of conductive bumps deposited on first ends of the conductive leads, wherein the conductive bumps physically contact the I/O pads on the die, wherein the conductive bumps are compliant bumps.

2. The apparatus as recited in claim 1, wherein the die is mounted in a recess formed in the glass substrate.

3. An apparatus comprising:
    a glass substrate having a plurality of conductive leads deposited thereon;
    a die mounted on the glass substrate, the die having a plurality of input/output ("I/O") pads for providing electrical access to circuitry inside the die;
    circuitry for connecting the plurality of I/O pads to the plurality of conductive leads on the glass substrate further comprising a heat sink attached to the die by a thermally conductive adhesive; and
    wherein in the die is mounted to a recess in the heat sink.

4. The apparatus as recited in claim 1, further comprising circuitry for connecting the plurality of conductive leads to conductive circuitry on a printed circuit board ("PCB").

5. The apparatus as recited in claim 4, further comprising an adhesive for mounting the apparatus to the PCB.

6. The apparatus as recited in claim 1, wherein the connecting circuitry further comprises a plurality of wire bonds.

7. The apparatus as recited in claim 6, wherein the die is mounted on the glass substrate.

8. An apparatus comprising:
    a glass substrate having a plurality of conductive leads deposited thereon;
    a die mounted in fixed relationship to the glass substrate, the die having a plurality of input/output ("I/O") pads for providing electrical access to circuitry inside the die; and
    circuitry for connecting the plurality of I/O pads to the plurality of conductive leads on the glass substrate, wherein the glass substrate includes a plurality of holes formed therethrough and a conducting material deposited in each of the plurality of holes to form ball contacts on an underside of the glass substrate, wherein the conducting material is connected to the plurality of conductive leads.

9. The apparatus as recited in claim 8, wherein the ball contacts are adaptable for contacting conductive traces on a PCB.

10. An apparatus comprising:

a glass substrate having a plurality of conductive leads deposited thereon;

a die mounted in fixed relationship to the glass substrate, the die having a plurality of input/output ("I/O") pads for providing electrical access to circuitry inside the die; and circuitry for connecting the plurality of I/O pads to the plurality of conductive leads on the glass substrate, wherein the conductive leads wrap around to an underside of the glass substrate and terminate in ball contacts adaptable for coupling to conductive traces on a PCB.

11. The apparatus as recited in claim 10, wherein the edges of the glass substrate are rounded and support the wrapped around conductive leads.

12. The apparatus as recited in claim 1, wherein the glass substrate has a hole formed therein, wherein the die is mounted in the hole.

13. The apparatus as recited in claim 12, wherein the die and the glass substrate are mounted on an other substrate.

14. The apparatus as recited in claim 1, wherein the die is mounted on the glass substrate, wherein the connecting circuitry further comprises a plurality of conductive bumps deposited on first ends of the conductive leads, wherein the conductive bumps physically contact the I/O pads on the die, further comprising a heat sink attached to the die by a thermally conductive adhesive, further comprising circuitry for connecting the plurality of conductive leads to conductive circuitry on a printed circuit board ("PCB"), further comprising an adhesive for mounting the apparatus to the PCB.

15. The apparatus as recited in claim 10, wherein the conductive leads are fabricated on separate flex that is then bonded to the glass substrate.

16. A glass substrate;

a chip die mounted on the glass substrate with an adhesive underfill therebetween, wherein the I/O pads on the chip die physically contact electrical traces deposited on the glass substrate;

a first heat sink mounted to the chip die with a thermal adhesive, wherein the first heat sink is also attached to the glass substrate with another adhesive;

a printed circuit board having a second heat sink, wherein the second heat sink is connected to the first heat sink using an adhesive; and solder connections for interconnecting the electrical traces on the glass substrate to electrical traces on the printed circuit board.

* * * * *